US011137679B2

(12) United States Patent
Jung

(10) Patent No.: US 11,137,679 B2
(45) Date of Patent: Oct. 5, 2021

(54) METHODS OF FORMING IMPRINTED PATTERNS AND IMPRINTING APPARATUSES USED THEREIN

(71) Applicant: SK hynix Inc., Icheon-si (KR)

(72) Inventor: Wooyung Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 356 days.

(21) Appl. No.: 15/961,503

(22) Filed: Apr. 24, 2018

(65) Prior Publication Data

US 2019/0086795 A1    Mar. 21, 2019

(30) Foreign Application Priority Data

Sep. 18, 2017    (KR) .................. 10-2017-0119826

(51) Int. Cl.
*G03F 7/00*    (2006.01)
(52) U.S. Cl.
CPC .................. *G03F 7/0002* (2013.01)
(58) Field of Classification Search
None
See application file for complete search history.

(56) References Cited

U.S. PATENT DOCUMENTS

| 8,011,916 B2 | 9/2011 | Suehira et al. |
| 8,946,093 B2 | 2/2015 | Mikami |
| 2006/0266916 A1* | 11/2006 | Miller .................. B82Y 10/00 249/134 |
| 2010/0330807 A1* | 12/2010 | Kobayashi ............. B82Y 40/00 438/689 |
| 2012/0149211 A1* | 6/2012 | Ojima ................... G03F 7/0002 438/758 |
| 2013/0078820 A1* | 3/2013 | Mikami .............. H01L 21/6715 438/778 |

FOREIGN PATENT DOCUMENTS

| JP | 2008066647 A | * | 3/2008 |
| JP | 4871145 B2 | * | 2/2012 |
| KR | 1020080067915 A | | 7/2008 |
| KR | 101707898 B1 | | 2/2017 |

OTHER PUBLICATIONS

Machine English Translation of JP-2008066647-A, Retrieved Jun. 16, 2020 (Year: 2008).*
Machine English Translation of JP-4871145-B2, Retrieved Jun. 16, 2020 (Year: 2012).*

* cited by examiner

*Primary Examiner* — Peter L Vajda
*Assistant Examiner* — Adrianna N Konves
(74) *Attorney, Agent, or Firm* — William Park & Associates Ltd.

(57) ABSTRACT

An imprinting apparatus and methods of forming imprinted patterns are provided. The imprinting apparatus may include an imprint template and an exposure system. The imprint template may include a mesa portion and a light blocking layer. The mesa portion may have a patterned surface providing imprinting patterns, and the light blocking layer may define a window region. The exposure system may be configured to alternately generate a first exposure light travelling toward the window region and a second exposure light travelling toward the patterned surface.

9 Claims, 14 Drawing Sheets

METHODS OF FORMING IMPRINTED PATTERNS AND IMPRINTING APPARATUSES USED THEREIN

CROSS-REFERENCE TO RELATED APPLICATIONS

The present application claims priority under 35 U.S.C 119(a) to Korean Application No. 10-2017-0119826, filed on Sep. 18, 2017, which is incorporated herein by references in its entirety.

BACKGROUND

1. Technical Field

Various embodiments of the present disclosure may generally relate to techniques for forming patterns and, more particularly, to methods of forming imprinted patterns with a nanoimprint lithography (NIL) technique and imprinting apparatuses used therein.

2. Related Art

In the semiconductor industry, forming fine patterns on a wafer has been required in order to provide integrated circuits having a high integration density. Accordingly, a lot of effort has been focused on developing technologies for transferring fine pattern images onto a wafer. A nanoimprint lithography (NIL) technique has been evaluated as an attractive lithography technique which is efficiently usable for fabrication of nanostructures at a low cost.

The NIL technique corresponds to a lithography technique for transferring pattern images with a template including nanostructures. According to a typical NIL technique, a template in which the nanostructures are carved may be put on an imprint medium layer and the template may be pressed toward the imprint medium layer to transfer a feature of the nanostructures into the resist layer. In an area of the NIL technique, various attempts to more accurately and rapidly transfer fine pattern images have been developed to obtain a high throughput.

SUMMARY

According to an embodiment, there may be provided an imprinting apparatus. The imprinting apparatus may include a substrate, an imprint template, and an exposure system. The substrate may have a surface on which an imprint medium layer is formed. The imprint template may include a mesa portion and a light blocking layer. The mesa portion may have a patterned surface that provides imprinting patterns to be transferred to the imprint medium layer, and the light blocking layer may be located outside the region of the patterned surface to define a window region. The exposure system may be configured to alternately generate a first exposure light travelling toward the window region and a second exposure light travelling toward the patterned surface.

According to an embodiment, there may be provided a method of forming imprinted patterns. The method may include forming an imprint medium layer including an imprint region and a boundary region and providing an imprint template over the imprint medium layer. The imprint template may include a mesa portion and a light blocking layer onto the imprint medium layer. The mesa portion may have a patterned surface that provides imprinting patterns, and the light blocking layer may be spaced apart from the patterned surface and is located outside the region of the patterned surface to define a window region. The imprint template may be lowered to bring the imprinting patterns in contact with a surface of the imprint medium layer. A first exposure light may be irradiated onto the window region to form an extrusion barrier in the boundary region. The imprint template may be used to embed the imprinting patterns into the imprint medium layer. A second exposure light may be irradiated onto the patterned surface to cure the imprint region.

According to an embodiment, there may be provided a method of forming imprinted patterns. The method may include forming an imprint medium layer including an imprint region and a boundary region, providing an imprint template over the imprint medium layer. The imprint template may have imprinting patterns onto the imprint medium layer. The imprint template may be lowered to bring the imprinting patterns in contact with a surface of the imprint medium layer. The method may further include irradiating a first exposure light onto the boundary region using a light source and a mirror device to form an extrusion barrier in the boundary region. The mirror device may be configured to change a travelling direction and a beam size of a light generated by the light source. The imprint template may be used to embed the imprinting patterns into the imprint medium layer. The light generated by the light source may be converted into a second exposure light by the mirror device, and the second exposure light may be irradiated onto the imprint region through the patterned surface to cure the imprint region.

DETAILED DESCRIPTION

Figure 1:
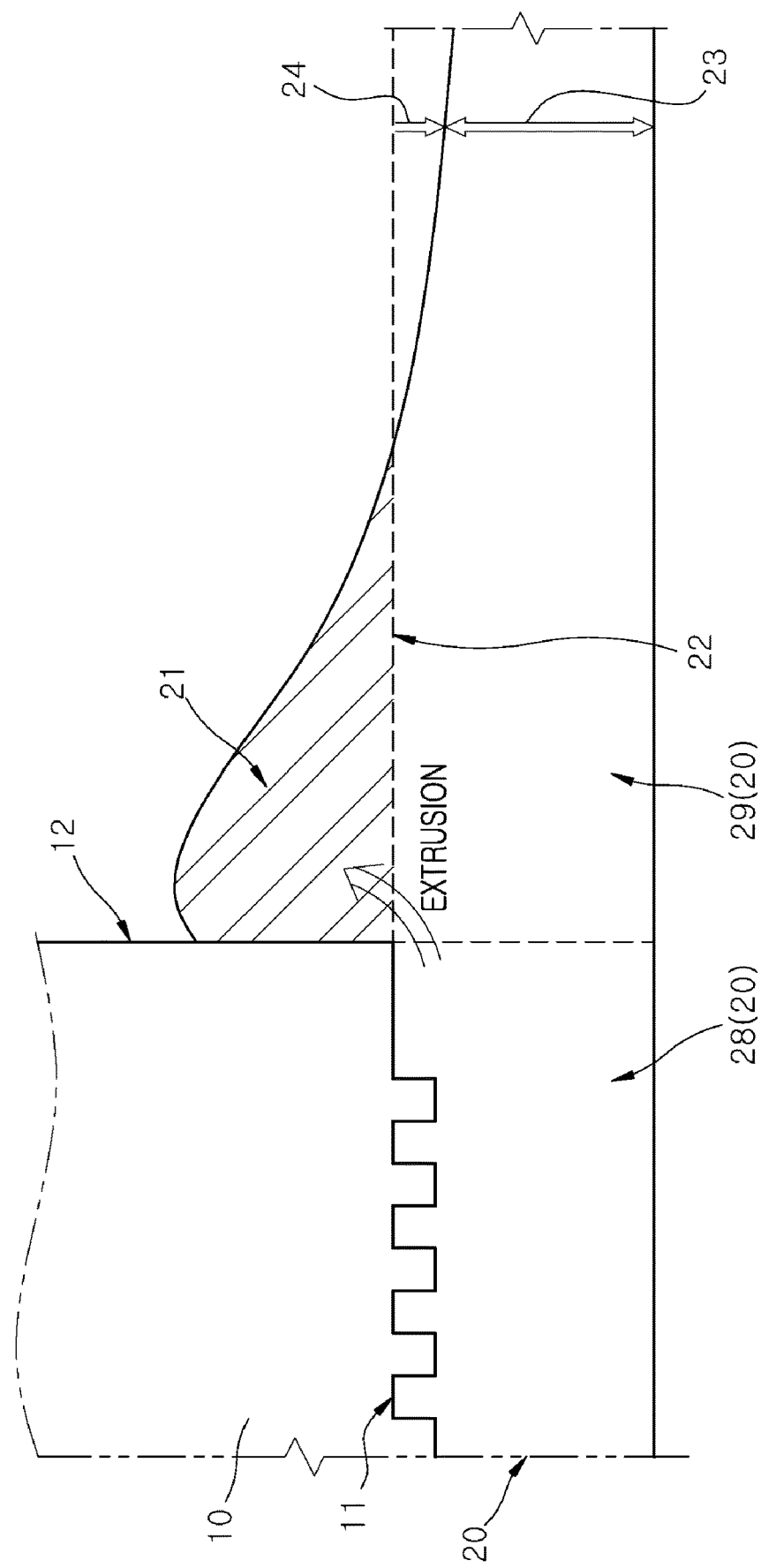
FIG. 1 is a cross-sectional view illustrating an over-extrusion phenomenon of an imprint medium layer at an imprinting step.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence. Thus, a first element in some embodiments could be termed a second element in other embodiments without departing from the teachings of the concepts.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

The following embodiments may be applied to realization of integrated circuits such as dynamic random access memory (DRAM) devices, phase change random access memory (PcRAM) devices or resistive random access memory (ReRAM) devices. Moreover, the following embodiments may be applied to realization of memory devices such as static random access memory (SRAM) devices, flash memory devices, magnetic random access memory (MRAM) devices or ferroelectric random access memory (FeRAM) devices. Furthermore, the following embodiments may be applied to realization of logic devices in which logic circuits are integrated. The following embodiments may also be applied to techniques for realizing various products including fine patterns.

Same reference numerals refer to same elements throughout the specification. Even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

FIG. 1 is a cross-sectional view illustrating an overextrusion phenomenon of an imprint medium layer at an imprinting step.

Referring to FIG. 1, a nanoimprint lithography (NIL) process may be performed to transfer patterns into an imprint medium layer 20 with an imprint template 10. During the NIL process, imprinting patterns 11 included in the imprint template 10 may be embedded into the imprint medium layer 20. Thus, a portion of the imprint medium layer 20 may be pushed to extrude out of an imprint region 28. Since a portion of the imprint medium layer 20 is pushed to extrude out of the imprint region 28, a protrusion portion 21 may be formed to be adjacent to a sidewall 12 of the imprint template 10. The protrusion portion 21 may be formed to protrude from an initial surface 22 of the imprint medium layer 20.

If the protrusion portion 21 excessively protrudes from the initial surface 22 of the imprint medium layer 20, the initial surface 22 of an outer region 29 of the imprint medium layer 20, which is far from the imprint region 28, may be lowered to cause a thinning phenomenon. That is, the initial surface 22 of the outer region 29 may be lowered to provide the outer region 29 having a thickness 23 which is reduced by a certain thickness 24 from an initial thickness of the imprint medium layer 20. The protrusion portion 21 and the outer region 29 having the thickness 23 may cause a nonuniform thickness of the imprint medium layer 20. If the thickness uniformity of the imprint medium layer 20 is degraded due to the protrusion portion 21 and the outer region 29, imprinted patterns may exhibit a poor accuracy to reduce a process yield. In addition, since the protrusion portion 21 is formed along the sidewall 12 of the imprint template 10, the imprint template 10 may be contaminated by the protrusion portion 21.

A method of forming imprinted patterns according to an embodiment will be described hereinafter with reference to FIGS. 2 to 11. According to the embodiments illustrated in FIGS. 2 to 11, it may prevent a portion of an imprint medium layer from excessively extruding out of an imprint region while an imprint shot is performed. FIGS. 2 to 5 are plan views illustrating a method of forming imprinted patterns according to an embodiment. FIGS. 2 to 5 illustrate surface features of an imprint medium layer 200 according to some imprint steps. FIGS. 6 to 11 are cross-sectional views illustrating a method of forming imprinted patterns according to an embodiment. FIGS. 6 to 11 cross-sectional views illustrating positions of an imprint template 300 and surface profiles of the imprint medium layer 200 according to some imprint steps.

Figure 2:
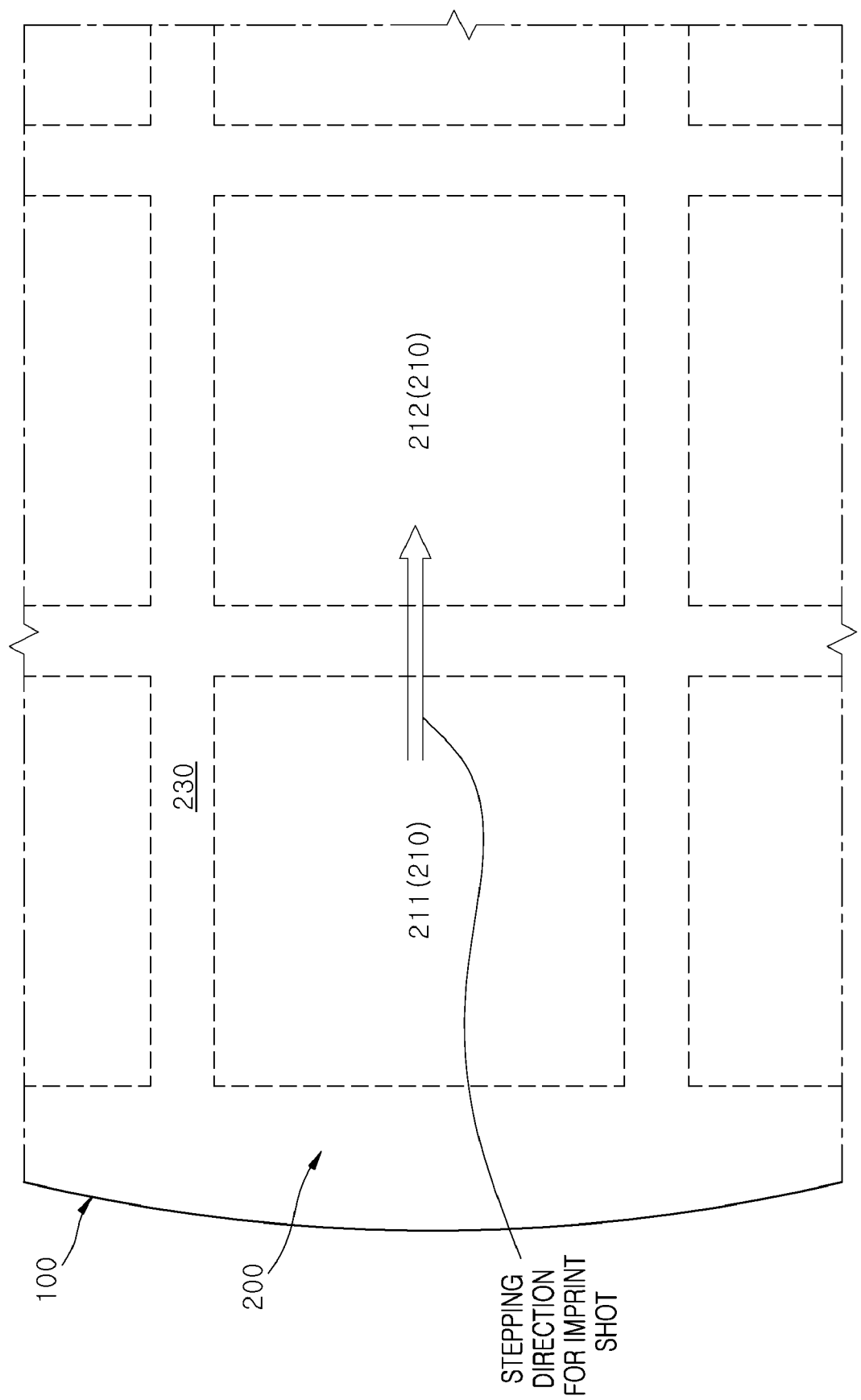
FIGS. 2 to 5 are plan views illustrating a method of forming imprinted patterns according to an embodiment of the present disclosure.

FIG. 2 illustrates a plan view of the imprint medium layer 200 formed on a substrate 100. The substrate 100 may be a semiconductor wafer. The imprint medium layer 200 may be formed on a substrate other than a semiconductor wafer, for example, a dielectric substrate or a metallic substrate. The imprint medium layer 200 may be formed by coating a resist material which is cured by an exposure light such as an ultraviolet ray. The resist material may be coated on a wafer using a spin coating process, an ink jetting process or a drop dispense process.

The resist material for forming the imprint medium layer 200 may include a material, which is cured by ultraviolet ray and which is used in an imprint lithography process. For example, the resist material may include a resin material containing a photo initiator or a photosensitizer that reacts on an ultraviolet ray. The resist material may include a polymer material which is polymerized from a monomer material such as an acrylate material or a methacrylate material. The resist material may be formed of a material which is polymerized by photo initialization. For example, the resist material may be formed of a mixture of a monomer and a photo initiator. The curable resist material may further include an accentuator such as a dimethyl siloxane derivative material.

The resist material may have a viscosity which is lower than a viscosity of a thermoset resin and a thermoplastic resin which are used in a hot imprint lithography process. Thus, the resist material may move fast to quickly fill concave regions of a template while an imprint step is performed. Accordingly, the imprint step can be performed at a low temperature and under a low pressure to improve the throughput in a fabrication process of fine patterns.

The imprint medium layer 200 may be formed by spin-coating a resist material on the substrate 100. The imprint medium layer 200 may be formed to cover an entire portion of a surface of a large-sized wafer. The imprint medium layer 200 may include an array of imprint regions 210 onto which imprinting patterns of an imprint template are transferred. Since the imprinting patterns of the imprint template are transferred onto the imprint regions 210, the imprint regions 210 may correspond to field regions.

The imprint regions 210 may be defined and separated by a boundary region 230. For example, the imprint regions 210 may include a first imprint region 211 and a second imprint region 212 which are adjacent to each other, and the first and second imprint regions 211 and 212 may be separated from each other by the boundary region 230. The boundary region 230 may be disposed to surround each of the imprint regions 210. The boundary region 230 may be a scribe lane defining the imprint regions 210 corresponding to the field regions.

An imprint shot may be performed to transfer the imprinting patterns of the imprint template onto the imprint regions 210. For example, a first imprint shot may be performed to transfer the imprinting patterns of the imprint template onto the first imprint region 211 of the imprint regions 210, and a second imprint shot may be performed to transfer the imprinting patterns of the imprint template onto the second imprint region 212 of the imprint regions 210. As such, the plurality of imprint shots may be sequentially performed onto the imprint regions 210, respectively. Since the imprint medium layer 200 is spin-coated on an entire surface of the substrate 100 before the plurality of imprint shots are sequentially performed, it may be unnecessary to coat the imprint medium layer 200 before each of the plurality of imprint shots is performed. Thus, a process time for performing the plurality of imprint shots may be reduced to improve the throughput of an imprint process.

Figure 3:
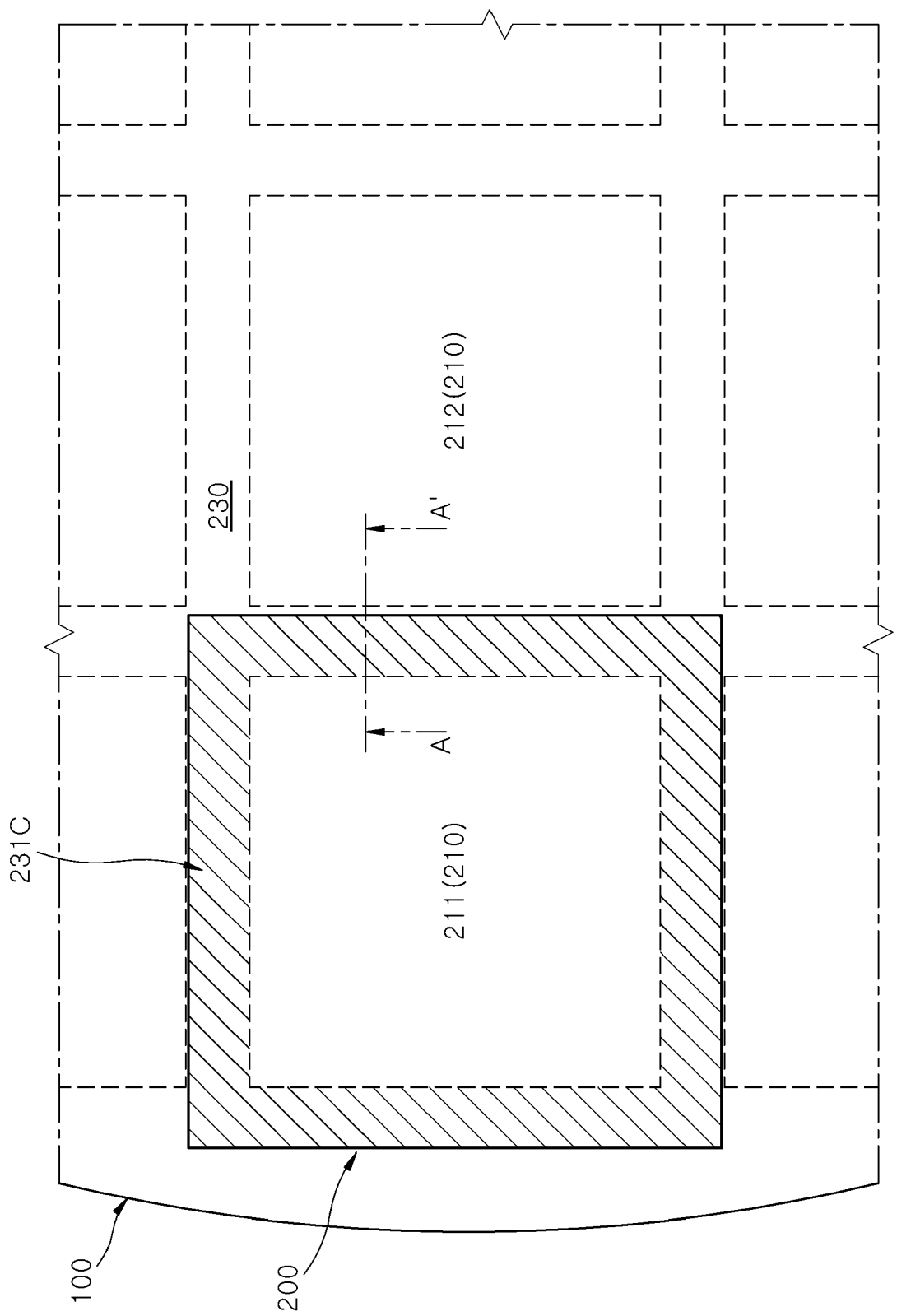
Figure 6:
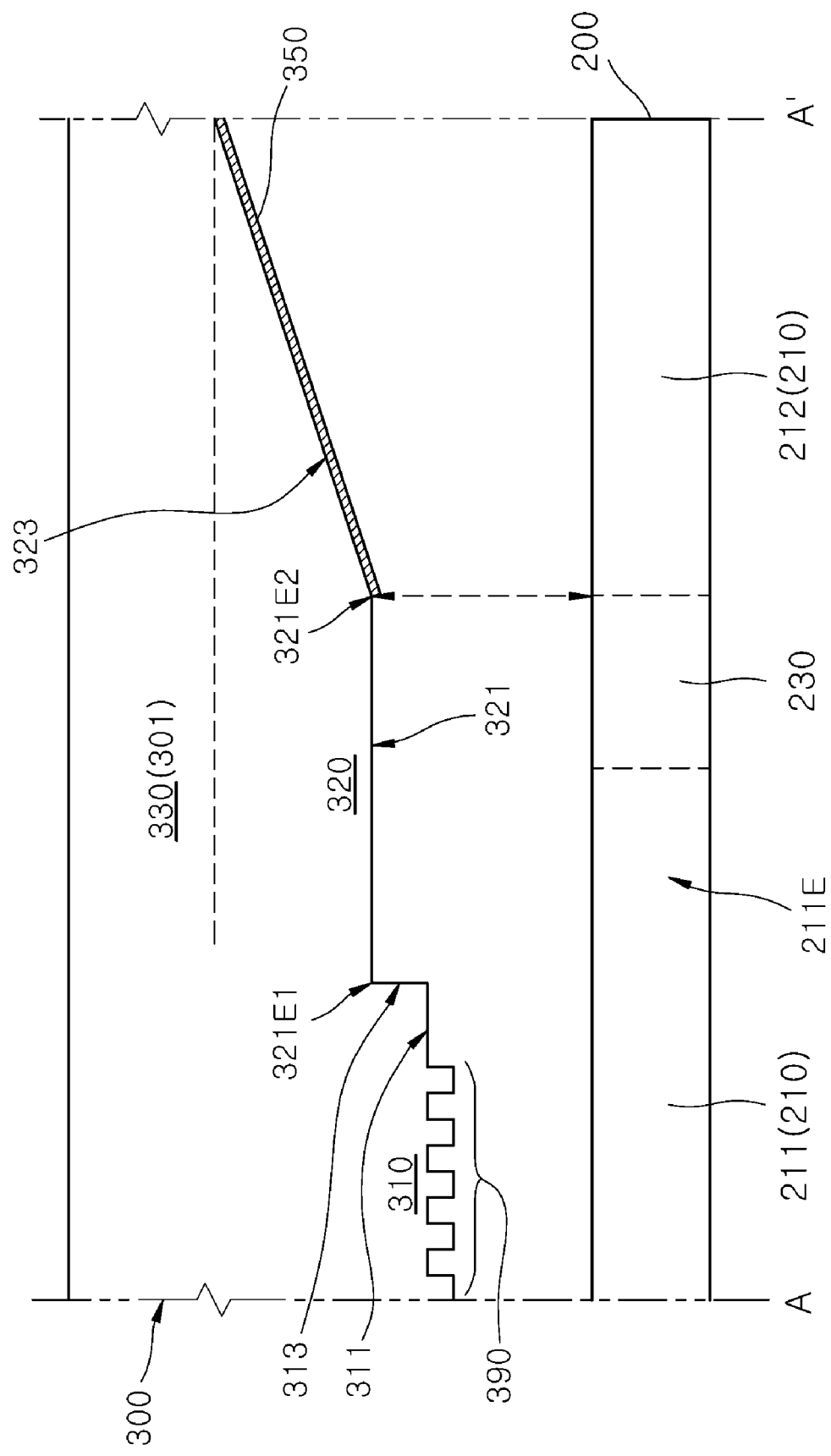
FIGS. 6 to 11 are cross-sectional views illustrating a method of forming imprinted patterns according to an embodiment of the present disclosure.
Figure 7:
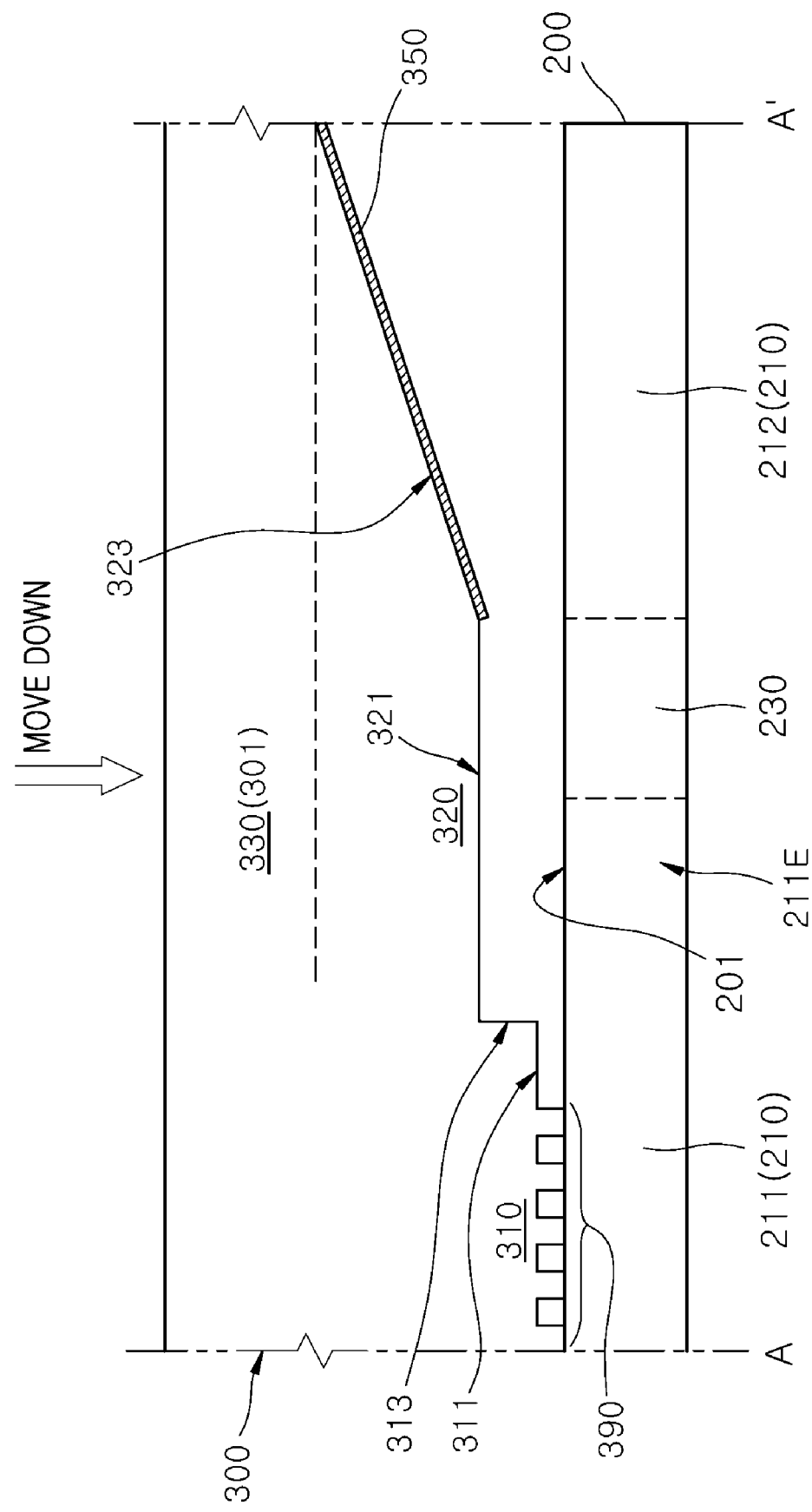
Figure 8:
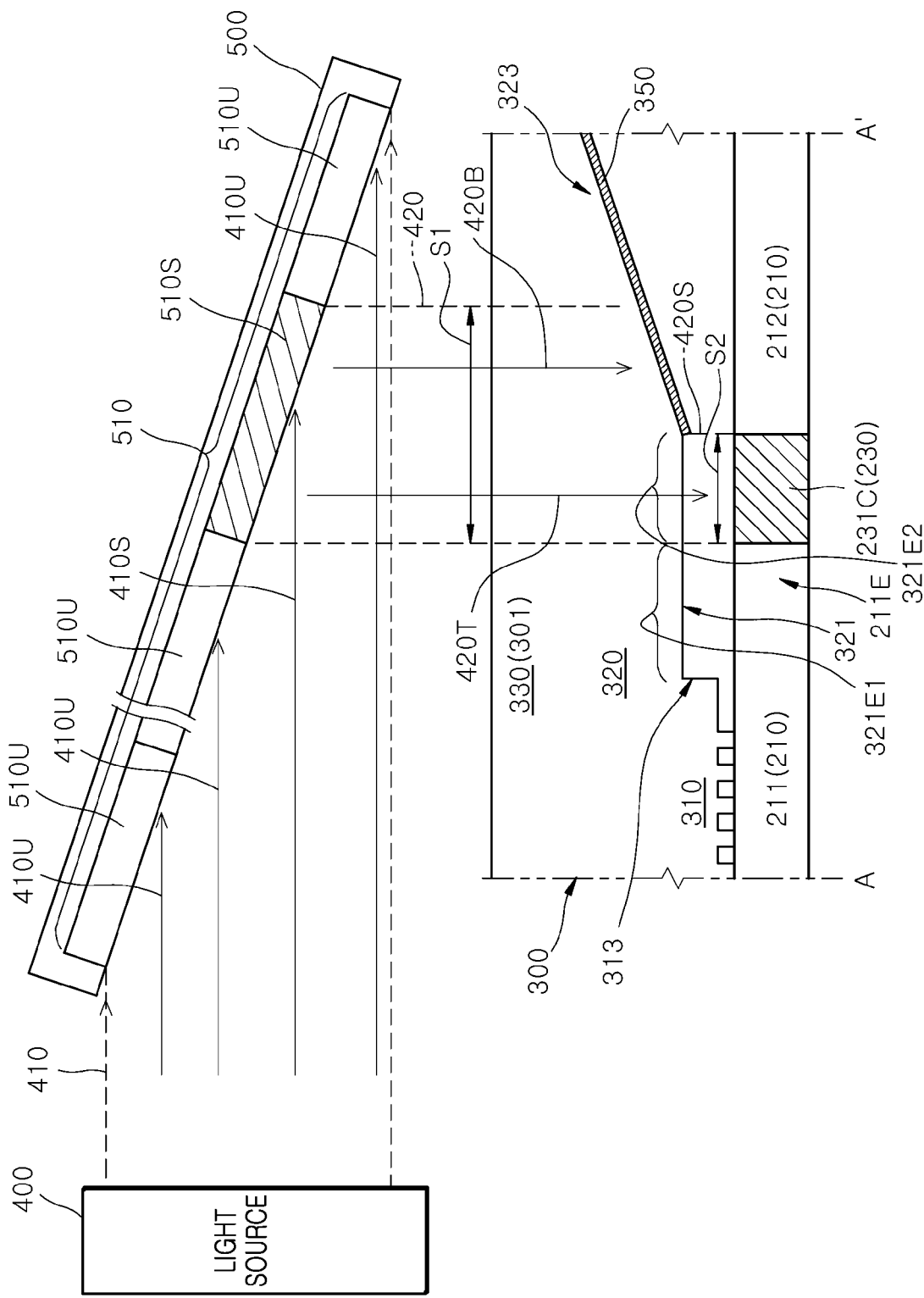

FIG. 3 is a plan view illustrating a step of forming a first extrusion barrier 231C in the boundary region 230. FIGS. 6 to 8 are cross-sectional views taken along a line A-A' of FIG. 3. Referring to FIG. 3, only a portion of the boundary region 230 surrounding the first imprint region 211 may be selectively and locally cured. As a result, the selected portion of the boundary region 230 may be locally cured to provide the first extrusion barrier 231C. The first extrusion barrier 231C may have a frame shape surrounding the first imprint region 211 when viewed from a plan view. That is, the first extrusion barrier 231C may be formed to define the first imprint region 211.

The first extrusion barrier 231C, which is locally cured, may have a viscosity which is higher than a viscosity of the imprint medium layer 200 in the first imprint region 211. Thus, the cured imprint medium material of the first extrusion barrier 231C may be hardened to exhibit a low fluidity. That is, the first extrusion barrier 231C may act as a fixed barrier. Accordingly, when the first imprint shot is applied to the first imprint region 211, the first extrusion barrier 231C may prevent the imprint medium material in the first imprint region 211 from extruding out of the first imprint region 211.

The first extrusion barrier 231C may be formed by a first local exposure step executed while the first imprint shot is performed. Since the first local exposure step for forming the first extrusion barrier 231C is executed while the first imprint shot is performed, it may be possible to prevent reduction in the throughput of the imprint process. A process for forming the first extrusion barrier 231C will be described in later with reference to FIGS. 6 to 8.

Referring to FIG. 6, an imprint template 300 may be loaded onto the imprint medium layer 200. The imprint template 300 may include a patterned surface 311 providing the imprinting patterns 390. The imprint template 300 may be located on the imprint medium layer 200 so that the patterned surface 311 of the imprint template 300 is vertically aligned with the first imprint region 211 of the imprint medium layer 200. While the patterned surface 311 is vertically aligned with the first imprint region 211, the patterned surface 311 may be spaced apart from the first imprint region 211.

The imprint template 300 may include a template body 301 having a plate shape or a flat board shape. The patterned surface 311 of the imprint template 300 may have a concave and convex surface profile to provide the imprinting patterns 390. The imprinting patterns 390 may be nano-sized structures which are transferred to the first imprint region 211. The imprinting patterns 390 may include mandrel-shaped patterns or dot-shaped patterns which are repeatedly arrayed.

The patterned surface 311 may be provided in a first mesa portion 310 protruding from a portion of the template body 301 to face a surface of the imprint medium layer 200. The template body 301 may include a body base 330, a second mesa portion 320 protruding from a portion of the body base 330, and the first mesa portion 310 protruding from a portion of the second mesa portion 320. The first mesa portion 310 may have the patterned surface 311 facing the imprint medium layer 200 and a first side surface 313 connecting the patterned surface 311 to the second mesa portion 320.

The second mesa portion 320 may have a second surface 321 which is connected to the first side surface 313 and is flat to face the imprint medium layer 200. The patterned surface 311 of the first mesa portion 310 and the second surface 321 of the second mesa portion 320 may be located at different levels to provide steps. For example, in an embodiment, the second surface 321 may be a stepped surface which is located at a different level from the patterned surface 311 to provide a window region. The second mesa portion 320 may be configured to have a third inclined surface 323 extending from the second surface 321. A light blocking layer 350 may be coated on the third inclined surface 323. In some embodiments, the second mesa portion 320 may include a vertical side surface that extends from the second surface 321 to reach the body base 330, instead of the third inclined surface 323. In such a case, the body base 330 may have a horizontal surface extending from the vertical side surface of the second mesa portion 320, and the light blocking layer 350 may be coated on the vertical side surface of the second mesa portion 320 and the horizontal surface of the body base 330. That is, if the second mesa portion 320 has the vertical side surface, the first mesa portion 310, the second mesa portion 320 and the body base 330 may provide a two-stepped structure. For example, in an embodiment, a second stepped surface may be the horizontal surface of the body base extending from the vertical side surface of the second mesa portion 320. In an embodiment, for example, the light blocking layer 350 may be coated on the vertical side surface of the second mesa portion 320 and the horizontal surface of the body base 330 as well as a portion of the second surface 321. As described above, the second mesa portion 320 may be modified to have any one of various shapes.

A first edge region 321E1 of the second surface 321 having a horizontally flat profile may be in contact with an edge of the first mesa portion 310, and a second edge region 321E2 of the second surface 321 may be in contact with the third inclined surface 323.

The second surface 321 may correspond to a surface of a window region through which a first exposure light passes during the first local exposure step for locally curing the imprint medium layer 200. The second surface 321 may be located at an outside region of the patterned surface 311. In an embodiment, for example, the second surface 321 may be located outside the region of the patterned surface 311 and thus, the light blocking layer 350 may be spaced apart from the patterned surface 311 by the second surface 321 and may also be located outside the region of the patterned surface 311. In an embodiment, for example, the light blocking layer 350 may be located outside the region of the patterned surface 311 and may cover a portion of the second surface 321 as well as the entire portion of the third inclined surface 323 (i.e., see FIG. 14). The third inclined surface 323 may be coated with the light blocking layer 350. The light blocking layer 350 may be formed of, for example, a chrome material to block the first exposure light. That is, the light blocking layer 350 may correspond to an aperture pattern for defining a size of the window region. One portion of the second surface 321 may be set to overlap with an edge region 211E of the first imprint region 211, and the other portion of the second surface 321 may be set to overlap with the boundary region 230.

The first side surface 313 may be a vertical surface which substantially perpendicular to the patterned surface 311. A level difference of about several hundred nanometers may be provided between the patterned surface 311 and the second surface 321 because of the presence of the first side surface 313 having a vertical profile. The level difference between the patterned surface 311 and the second surface 321 may be set to be about two hundred nanometers. The first mesa portion 310 may vertically protrude from the second mesa portion 320 to provide the level difference between the patterned surface 311 and the second surface 321. If the level difference between the patterned surface 311 and the second surface 321 increases to be greater than a certain value, for example, about two hundred nanometers, a portion of the first exposure light may be reflected to travel toward the second imprint region 212 during the first local exposure step for locally curing the imprint medium layer 200. On the contrary, if the level difference between the patterned surface 311 and the second surface 321 is reduced to be less than a certain value, for example, about two hundred nanometers, the second surface 321 of the second mesa portion 320 may be in direct contact with the imprint medium layer 200 during the first local exposure step for locally curing the imprint medium layer 200. In such a case, the second surface 321 of the imprint template 300 may be contaminated with the imprint medium layer 200, or the imprint medium layer 200 may have an abnormal surface profile.

As described above, the imprint template 300 may have the first and second mesa portions 310 and 320 that provides a stepped mesa structure, and the second mesa portion 320 may have the third inclined surface 323 coated with the light blocking layer 350. Thus, while the first local exposure step is executed to locally cure the imprint medium layer 200, it may prevent the first exposure light from being reflected to travel toward the second imprint region 212. That is, the light blocking layer 350 coated on the third inclined surface 323 may prevent the second imprint region 212 from being undesirably cured while the first local exposure step is executed to locally cure the boundary region 230 surrounding the first imprint region 211 in a subsequent process. Referring to FIG. 7, the imprint template 300 may move down or may be lowered to bring the imprinting patterns 390 of the imprint template 300 in contact with a surface 201 of the imprint medium layer 200. For example, the imprint template 300 may move down so that end portions of the imprinting patterns 390 are in contact with a surface 201 of the imprint medium layer 200.

Referring to FIG. 8, the first local exposure step may be performed to locally cure the boundary region 230 surrounding the first imprint region 211. The first local exposure step may be executed to irradiate a first exposure light 420 onto the second mesa portion 320 of the imprint template 300 while the imprinting patterns 390 of the imprint template 300 are in contact with the surface 201 of the imprint medium layer 200 (see FIG. 7). The first exposure light 420 may be aligned with the second mesa portion 320 so that a first portion 420T of the first exposure light 420 is irradiated onto the second edge region 321E2 of the second surface 321. The first exposure light 420 may be controlled not to be irradiated onto the first edge region 321E1 of the second surface 321 of the second mesa portion 320. The first edge region 321E1 of the second surface 321 may be in contact with the first side surface 313 of the first mesa portion 310, and the second edge region 321E2 of the second surface 321 may be in contact with the third inclined surface 323.

A first beam size S1 (or a first beam width) of the first exposure light 420 may be greater than a width of the boundary region 230. The first beam size S1 of the first exposure light 420 may be reduced to a second beam size S2 of an incident light 420S actually irradiated onto the imprint medium layer 200 (see FIG. 7) by adjusting an overlap area between the first exposure light 420 and the second surface 321.

If an irradiation position of the first exposure light 420 is controlled so that the first exposure light 420 is irradiated onto the second surface 321 and the third inclined surface 323, the first portion 420T of the first exposure light 420 may be irradiated onto the imprint medium layer 200 through the second edge region 321E2 of the second surface 321. In such a case, since the remaining portion (i.e., a second portion 420B) of the first exposure light 420 is irradiated toward the third inclined surface 323, the second portion 420B of the first exposure light 420 may be blocked by the light blocking layer 350 coated on the third inclined surface 323. Thus, since only the first portion 420T of the first exposure light 420 may be irradiated onto the imprint medium layer 200, the second beam size S2 of the incident light 420S actually irradiated onto the imprint medium layer 200 may be relatively reduced as compared with the first beam size S1 of the first exposure light 420. The light blocking layer 350 may prevent the second portion 420B of the first exposure light 420 from being irradiated onto the second imprint region 212.

The imprint medium material in the boundary region 230 may be cured by the first portion 420T (i.e., the incident light 420S) of the first exposure light 420 to have a viscosity which is higher than a viscosity of the imprint medium material in the first and second imprint regions 211 and 212. As a result, the first extrusion barrier 231C may be formed in the boundary region 230 surrounding the first imprint region 211 by the first local exposure step.

Referring again to FIG. 8, it should be prohibited that the first exposure light 420 is irradiated toward the first mesa portion 310 of the imprint template 300. The first exposure light 420 has to be locally and selectively irradiated toward only the second mesa portion 320. Thus, the first beam size S1 of the first exposure light 420 has to be appropriately reduced. A light source 400 may be provided to include an ultraviolet (UV) lamp generating a first light 410, for example, a UV ray. It may be difficult that the first light 410 is generated by the light source 400 to have a beam size which is as small as the first beam size S1 of the first exposure light 420. Thus, a mirror device 500 may be disposed in a light path between the light source 400 and the imprint template 300 to generate the first exposure light 420 having the first beam size S1 from the first light 410.

The mirror device 500 may receive the first light 410 to generate the first exposure light 420 travelling in a direction which is different from a direction of the first light 410. The mirror device 500 may include a digital micromirror device (DMD). The DMD of the mirror device 500 may generate high resolution images using a light reflection device. The DMD of the mirror device 500 may be a device including a plurality of reflective micromirrors 510 which are integrated in a single chip. For example, the DMD of the mirror device 500 may include several hundreds of thousands of reflective micromirrors to several millions of reflective micromirrors. The DMD of the mirror device 500 may selectively reflect a portion 410S of the first light 410.

Only the selected portion 410S of the first light 410 may be irradiated onto one or more micromirrors 510S selected from the reflective micromirrors 510 and may be reflected by the selected micromirrors 510S to travel toward the second mesa portion 320. An unselected portion 410U of the first light 410 may be reflected by unselected micromirrors 510U among the reflective micromirrors 510 not to travel toward the second mesa portion 320.

The reflective micromirrors 510 may reflect the first light 410 to provide different light paths, respectively. Thus, only the selected portion 410S of the first light 410 may be reflected by the selected micromirrors 510S to act as the first exposure light 420 which is irradiated onto the second mesa portion 320. The reflective micromirrors 510 may be arrayed to have a small pitch of about 7.6 micrometers. Nevertheless, in the event that the first beam size S1 of the first exposure light 420 is greater than the second beam size S2 of the incident light 420S, the second beam size S2 of the incident light 420S may be defined and determined by the light blocking layer 350. Thus, the first extrusion barrier 231C having a narrow width may be locally formed in the boundary region 230 by selectively irradiating the incident light 420S having the second beam size S2 onto the boundary region 230.

Although FIG. 8 illustrates an example in which the first local exposure step for locally curing the imprint medium layer 200 is performed while the imprint template 300 is in contact with the surface 201 of the imprint medium layer 200, the present disclosure is not limited thereto. For example, in some other embodiments, the first local exposure step may also be performed even while the imprint template 300 moves down toward the imprint medium layer 200 (see FIG. 7). That is, the first local exposure step may be continuously performed while the imprint template 300 moves down toward the imprint medium layer 200 and while the imprint template 300 is in contact with the surface 201 of the imprint medium layer 200.

Figure 4:
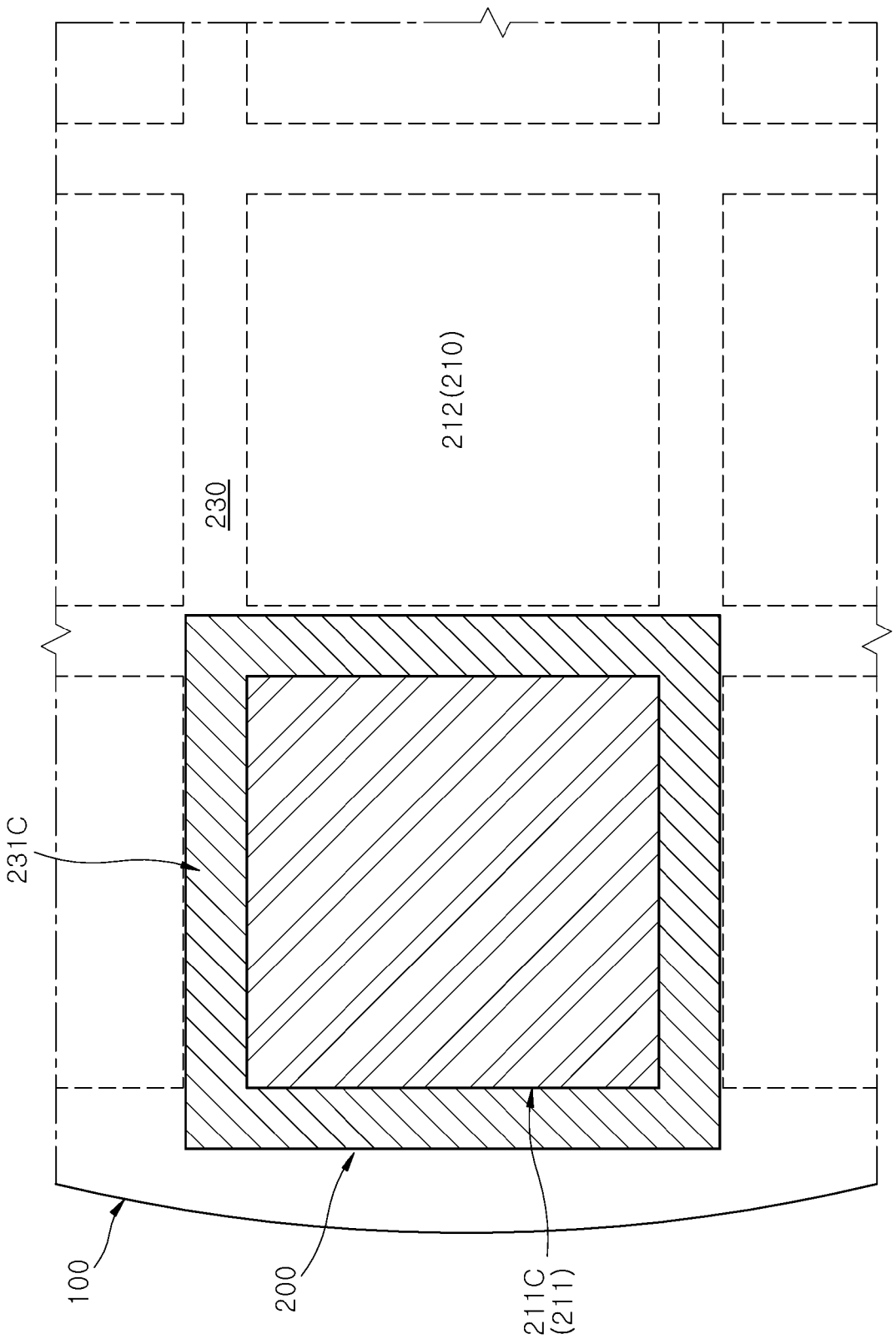
Figure 9:
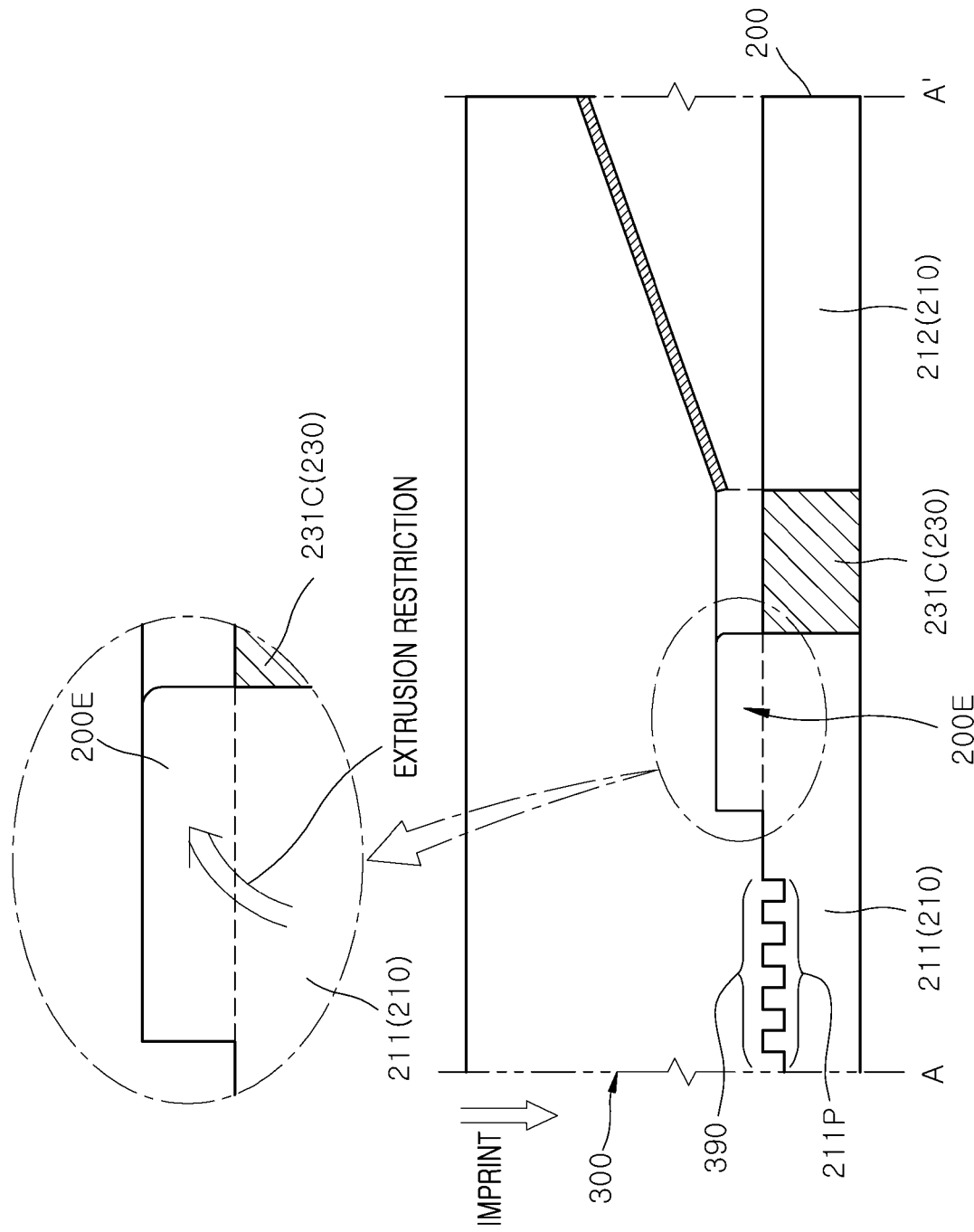
Figure 10:
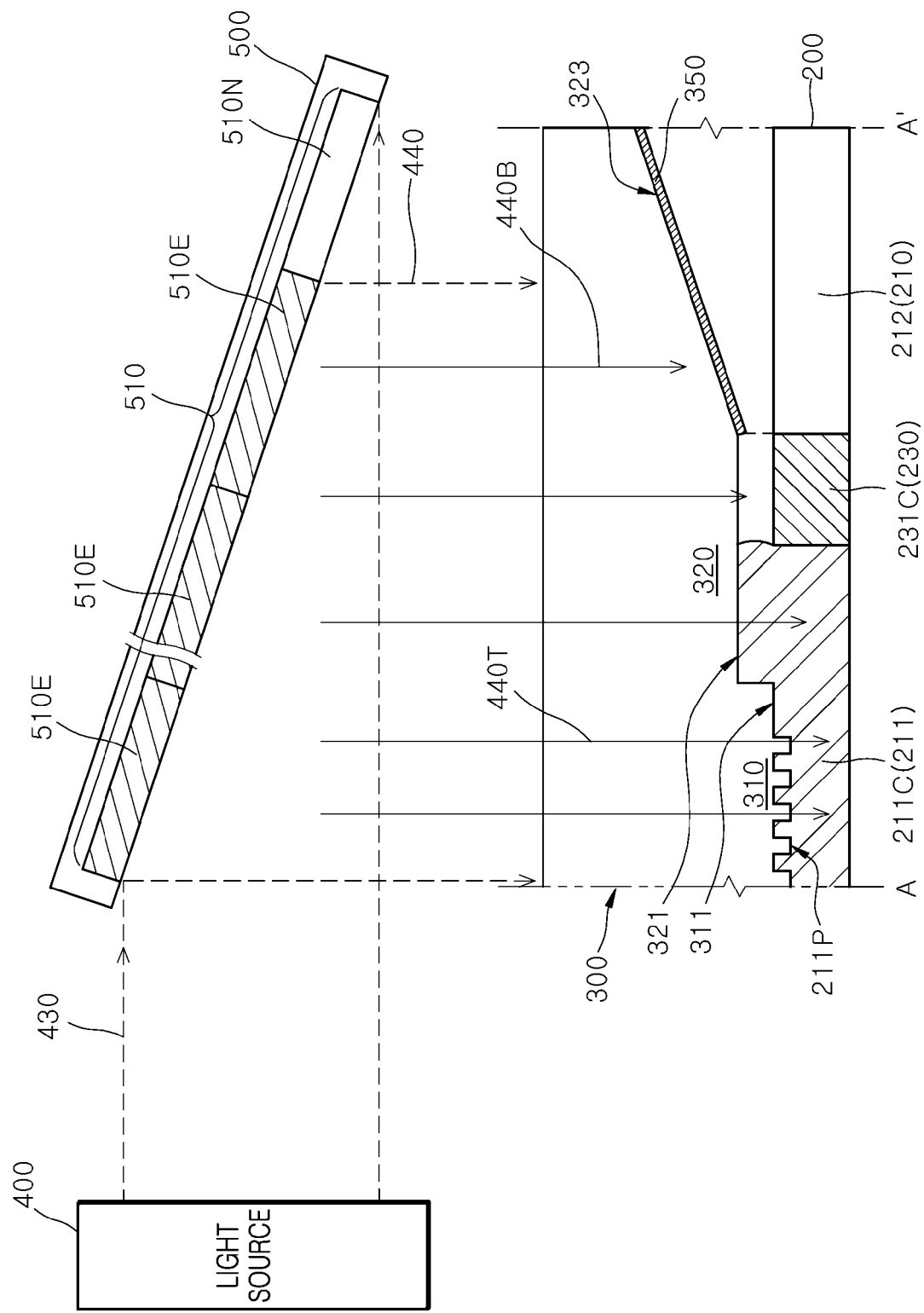
Figure 11:
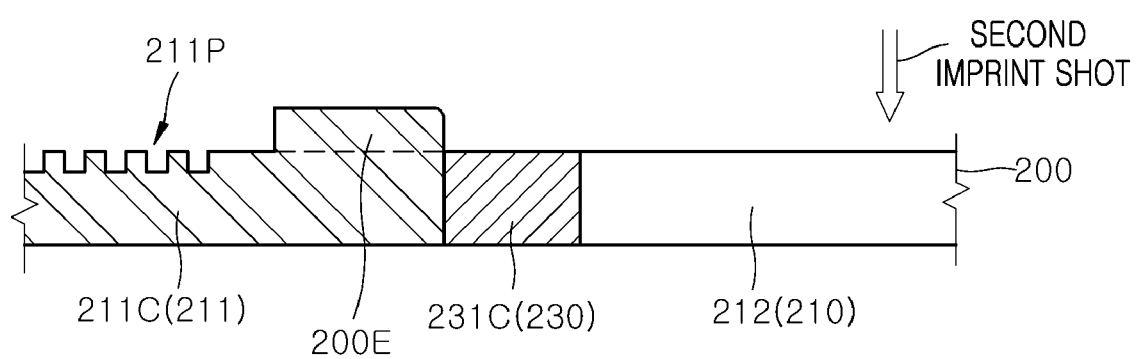

FIG. 4 illustrates a plan view of a first cured imprint region 211C and the first extrusion barrier 231C. FIGS. 9 to 11 are cross-sectional views illustrating a first imprint process which is applied to the first imprint region 211. Referring to FIG. 4, an imprint step and a second exposure step may be sequentially applied to the first imprint region 211. The first cured imprint region 211C may be formed after the second exposure step is performed.

As illustrated in FIG. 9, the imprint template 300 may be pressed down so that the imprinting patterns 390 of the imprint template 300 are carved or embedded into the first imprint region 211 of the imprint medium layer 200. As a result, imprinted patterns 211P having the same surface profile as the imprinting patterns 390 may be formed in the first imprint region 211 of the imprint medium layer 200. While the imprinting patterns 390 of the imprint template 300 are embedded into the first imprint region 211, the imprint medium material in the first imprint region 211 may be fluid. However, the imprint medium material in the first imprint region 211 may not extrude out of the first imprint region 211 because of the presence of the first extrusion barrier 231C.

Since the first extrusion barrier 231C has a relatively high viscosity due to the first local exposure step, the first extrusion barrier 231C may be substantially fixed not to be fluid. Thus, the first extrusion barrier 231C may act as a barrier that prevents the imprint medium material in the first imprint region 211 from extruding out of the first imprint region 211 while the imprinting patterns 390 of the imprint template 300 are embedded into the first imprint region 211. Since movement of the imprint medium material in the first imprint region 211 is restricted by the first extrusion barrier 231C, an extruded portion 200E may be formed on an edge of the first imprint region 211 while the imprinting patterns 390 of the imprint template 300 are embedded into the first imprint region 211.

Referring to FIG. 10, the second exposure step may be performed to cure the first imprint region 211. A second exposure light 440 may be irradiated onto the first and second mesa portions 310 and 320 of the imprint template 300 after the imprinting patterns 390 of the imprint template 300 are embedded into the first imprint region 211. The second exposure light 440 may be aligned with the first and second mesa portions 310 and 320 of the imprint template 300 so that a first portion 440T of the second exposure light 440 is irradiated onto the patterned surface 311 of the first mesa portion 310 and the second surface 321 of the second mesa portion 320. Even though a second portion 440B of the second exposure light 440 is irradiated toward the third inclined surface 323 of the second mesa portion 320, the light blocking layer 350 coated on the third inclined surface 323 may block the second portion 440B of the second exposure light 440. Thus, the light blocking layer 350 may prevent the second exposure light 440 from being irradiated onto the second imprint region 212.

The mirror device 500 may reflect a second light 430 outputted from the light source 400 to provide the second exposure light 440 travelling toward the imprint template 300. Micromirrors 510E selected from the reflective micromirrors 510 may selectively reflect a portion of the second light 430 to provide the second exposure light 440 that travels toward the first and second mesa portions 310 and 320. An unselected portion of the second light 430 may be reflected by unselected micromirrors 510N among the reflective micromirrors 510 not to travel toward the imprint template 300.

The second exposure light 440 may be set to have a beam size which is greater than a beam size (i.e., the first beam size S1) of the first exposure light (420 of FIG. 8). The number of the selected micromirrors 510E generating the second exposure light 440 may be greater than the number of the selected micromirrors (510S of FIG. 8) generating the first exposure light (420 of FIG. 8). Since the mirror device 500 is realized using the DMD, it may be possible to sequentially irradiate the first exposure light (420 of FIG. 8) and the second exposure light 440 onto the imprint template 300 using the same light source 400.

Figure 5:
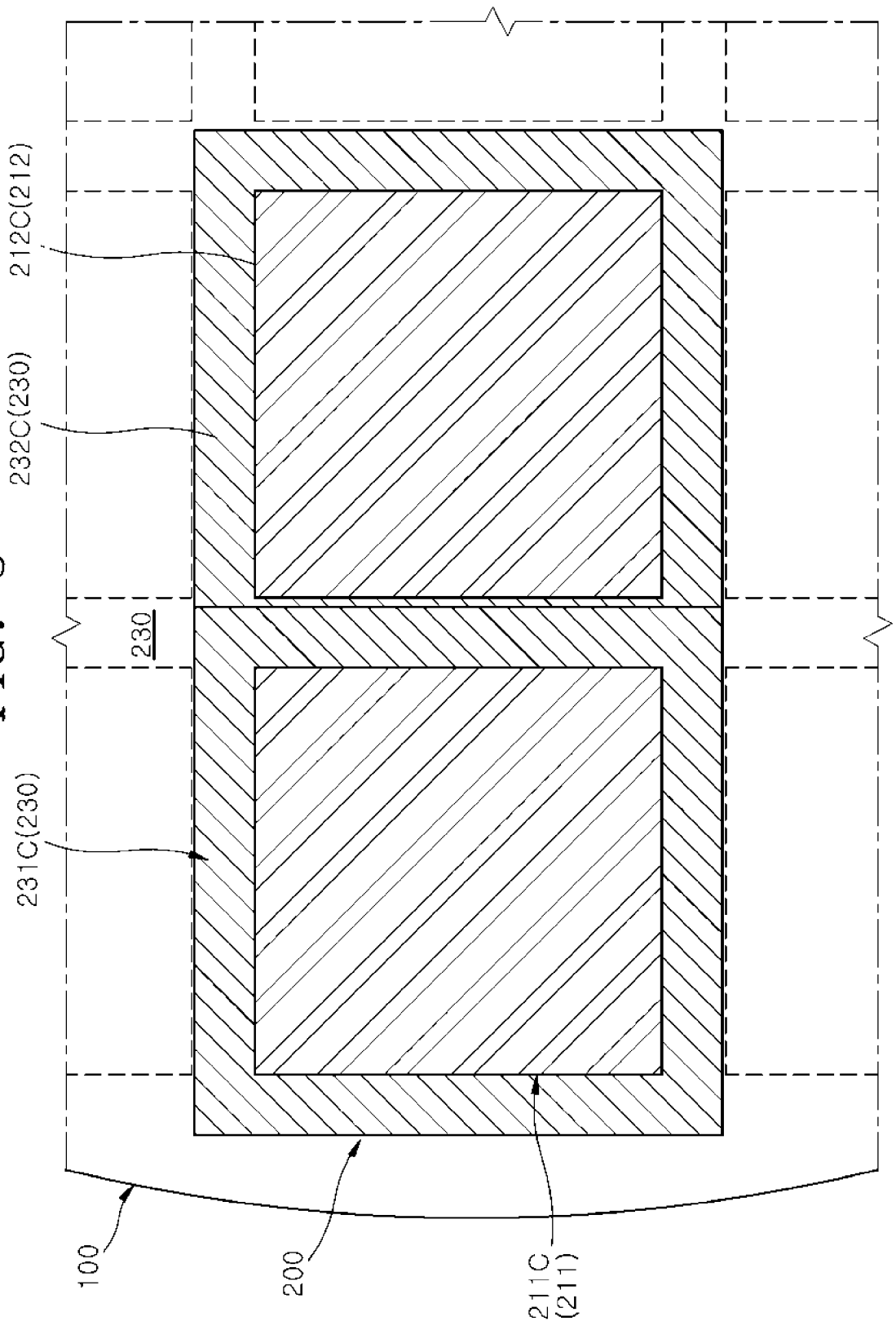

Referring to FIGS. 5 and 11, after the imprinted patterns 211P are formed in the first cured imprint region 211C cured by the first imprint shot, the second imprint shot may be performed to transfer the imprinting patterns 390 of the imprint template 300 onto the second imprint region 212 of the imprint regions 210. The second imprint shot may include a step of locally curing the boundary region 230 surrounding the second imprint region 212 to form a second extrusion barrier 232C and a step of curing the second imprint region 212. The second imprint region 212 may be cured to from a second cured imprint region 212C.

Figure 12:
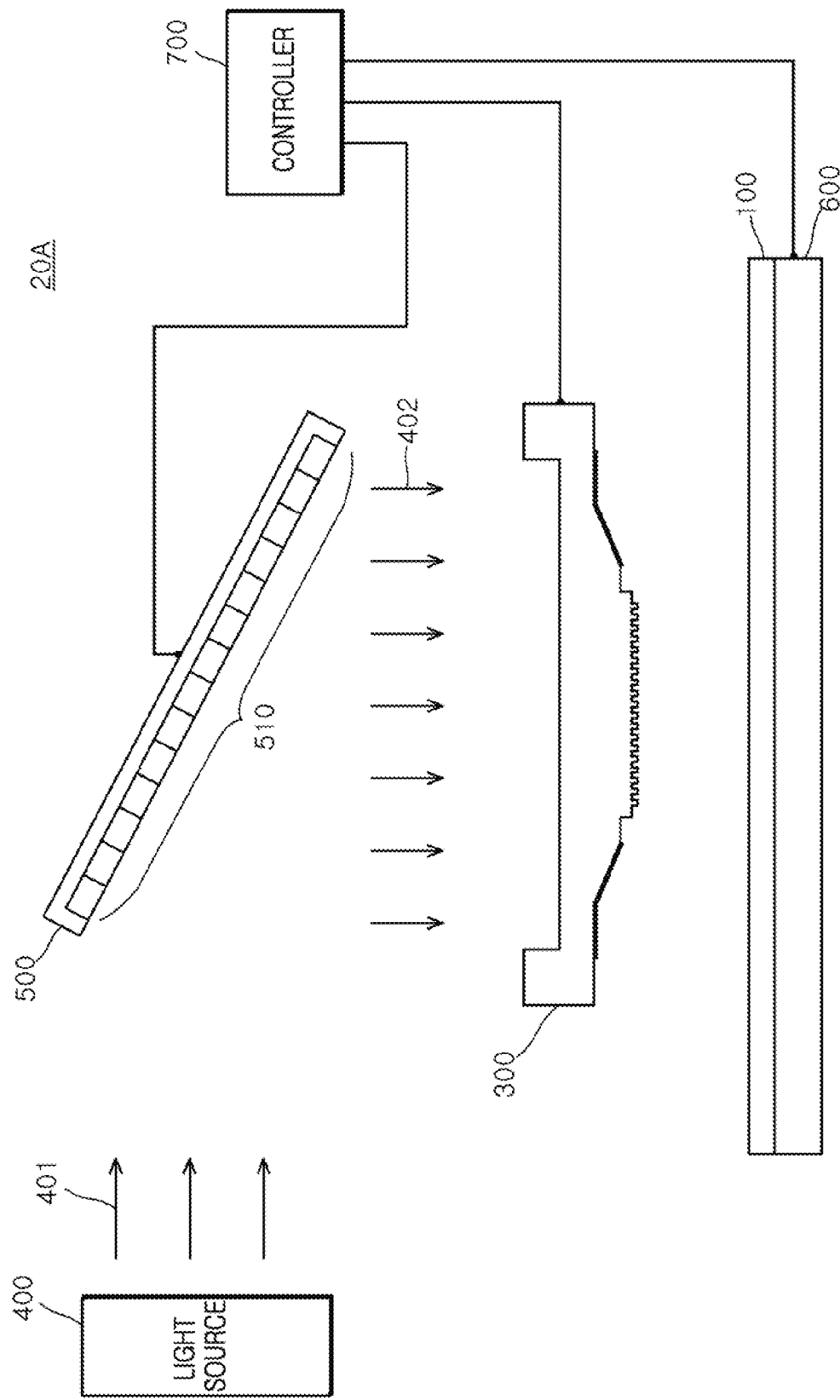
FIG. 12 is a schematic view illustrating an example of an imprinting apparatus used in a method of forming imprinted patterns according to an embodiment of the present disclosure.
Figure 13:
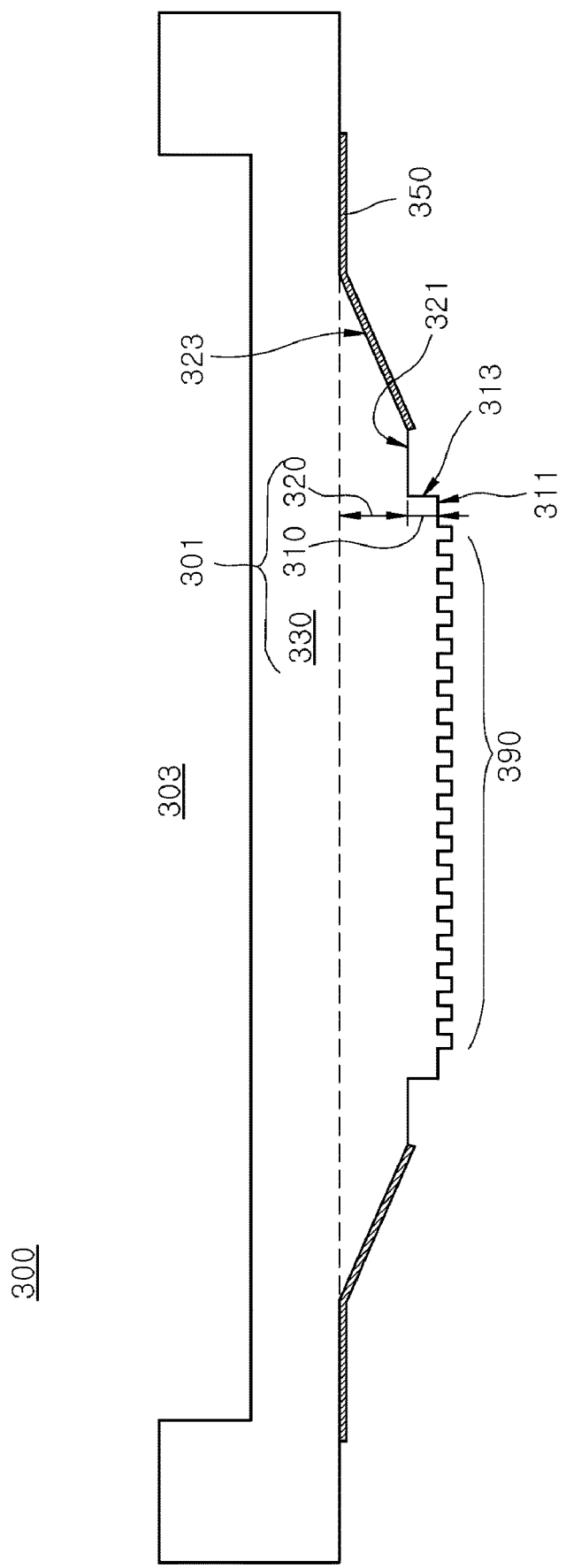
FIGS. 13 and 14 are cross-sectional views illustrating imprint templates used in a method of forming imprinted patterns according to an embodiment of the present disclosure.
Figure 14:
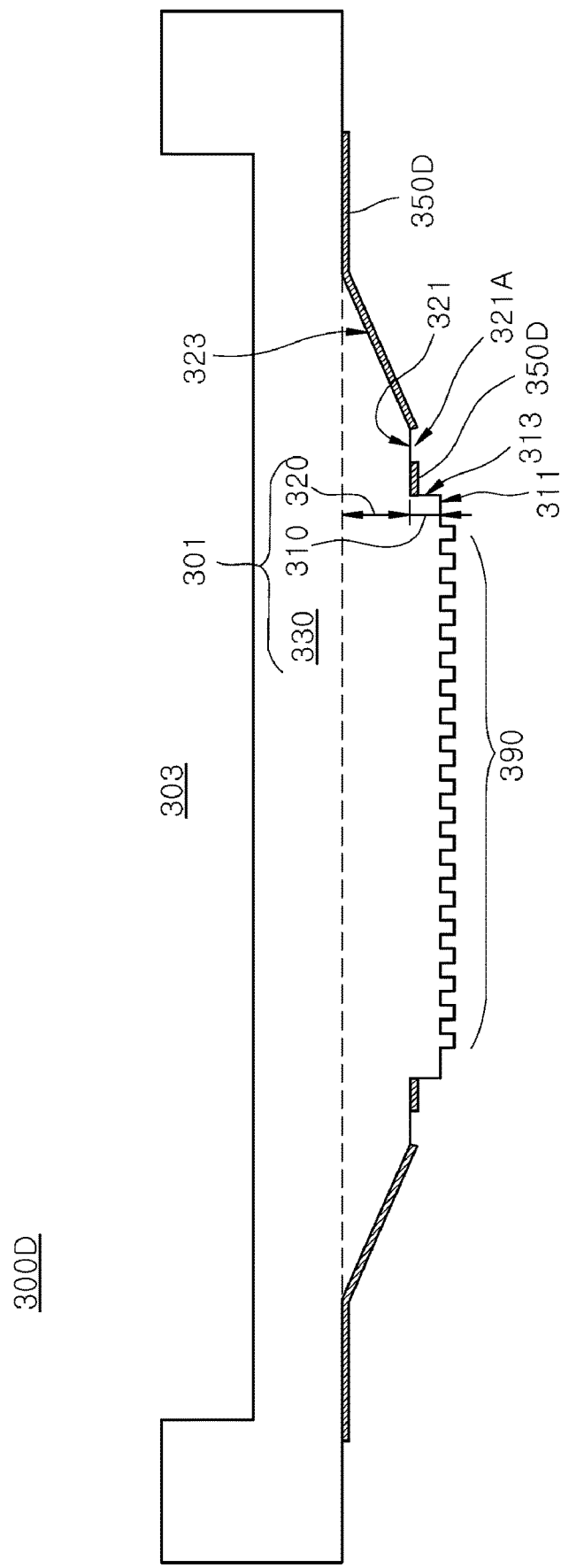

FIG. 12 is a schematic view illustrating an example of an imprinting apparatus 20A used in a method of forming imprinted patterns according to an embodiment of the present disclosure. FIGS. 13 and 14 are cross-sectional views illustrating imprint templates 300 and 300D employed in the imprinting apparatus 20A of FIG. 12.

Referring to FIG. 12, the imprinting apparatus 20A may be configured to include a substrate stage 600, the imprint template 300, an exposure system 400+500, and a controller 700. A wafer 100 (or a substrate) including an imprint medium layer may be mounted on the substrate stage 600. The controller 700 may control movement and operation of the substrate stage 600, movement of the imprint template 300, and operations of the mirror device 500 and the light source 400, while an imprint shot is performed. The controller 700 may operate so that the mirror device 500 converts a light 401 generated by the light source 400 into an exposure light 402. The mirror device 500 may include a digital micromirror device (DMD) having an array of the micromirrors 510.

Referring to FIG. 13, the imprint template 300 employed in the imprinting apparatus 20A may include the template body 301 and the first mesa portion 310 protruding from a portion of the template body 301 to have the patterned surface 311. The template body 301 may have a recessed backside surface which is opposite to the patterned surface 311. Accordingly, the recessed backside surface of the template body 301 may provide a cavity 303. The cavity 303 may help the first mesa portion 310 to warp so that a central portion of the patterned surface 311 of the first mesa portion 310 firstly contacts the imprint medium layer 200 when the imprint template 300 moves down to contact the surface (201 of FIG. 7) of the imprint medium layer (200 of FIG. 7). The cavity 303 may have a shape that is adequate for transformation of the first mesa portion 310. That is, the patterned surface 311 of the mesa portion 310 may easily warp to have a convex shape due to the cavity 303 while the imprint template 300 moves down to contact the imprint medium layer 200. Thus, a central portion of the patterned surface 311 of the first mesa portion 310 may firstly contact the imprint medium layer 200, and an entire portion of the patterned surface 311 may then be flat spread to contact the surface 201 of the imprint medium layer 200.

The template body 301 may be configured to have a multi-stepped mesa structure that includes the body base 330, the second mesa portion 320 protruding from a portion of the body base 330, and the first mesa portion 310 protruding from a portion of the second mesa portion 320. The multi-stepped mesa structure may be provided to prevent an edge of the second mesa portion 320 from being in contact with the imprint medium layer 200 during the imprint process. The second mesa portion 320 may have the third inclined surface 323 which is spaced apart from the patterned surface 311 and is located at an outside region of the patterned surface 311. A distance between the third inclined surface 323 and the imprint medium layer 200 may gradually increase as it becomes far from the patterned surface 311. Accordingly, it may be possible to prevent an edge of the second mesa portion 320 from being in contact with the imprint medium layer 200 while the imprint template 300 is pressed down to perform the imprint process.

The second surface 321 of the second mesa portion 320 may correspond to a surface of a window region through which the first portion (420T of FIG. 8) of the first exposure light (420 of FIG. 8) passes during the first local exposure step for locally curing the imprint medium layer 200. The window region may be set to surround the patterned surface 311 in a plan view. The window region may be located between the patterned surface 311 and the third inclined surface 323. The window region may be designed so that a portion of the window region overlaps with the boundary region (230 of FIG. 7) defining the first imprint region (211 of FIG. 7). The window region may include the second surface 321 that connects the first side surface 313 of the first mesa portion 310 to the third inclined surface 323 of the second mesa portion 320.

Referring to FIGS. 8 and 12, the light blocking layer 350 may be coated to cover the third inclined surface 323 extending from the second surface 321. The light blocking layer 350 may correspond to an aperture pattern for defining a size of the window region. The exposure system 400+500 may alternately generate the first portion 420T (of the first exposure light 420) which is irradiated onto the window region and the first portion 440T (of the second exposure light 440) which is irradiated onto the patterned surface 311.

The first portion 420T of the first exposure light 420 may be irradiated onto only a portion of the window region. The first portion 440T of the second exposure light 440 may be irradiated to penetrate the second edge region (321E2 of FIG. 8) of the second surface 321. The mirror device 500 of the exposure system 400+500 may reflect the first light (410 of FIG. 8) to provide the first exposure light 420 travelling toward the second edge region 321E2 (overlapping with a portion of the boundary region 230) of the second surface 321 and toward a portion of the third inclined surface 323. In such a case, the light blocking layer 350 may block the first exposure light 420 which is irradiated onto the third inclined surface 323.

Referring to FIG. 14, the imprint template 300D corresponding to an example of the imprint template 300 illustrated in FIG. 13 may include a light blocking layer 350D covering an entire portion of the third inclined surface 323 of the second mesa portion 320 and a portion of the second surface 321 of the second mesa portion 320. Thus, a planar area of a window region 321A defined by the light blocking layer 350D may be less than a planar area of the window region defined by the light blocking layer 350 of FIG. 13. A portion of the light blocking layer 350D may cover a portion of the second surface 321 to contact the first side surface 313 of the first mesa portion 310. Accordingly, even though the first exposure light (420 of FIG. 8) is irradiated onto an entire region of the second surface 321, the second beam size (S2 of FIG. 8) of the incident light (420S of FIG. 8) penetrating the window region 321A may be controlled to be uniform or constant. The light blocking layer 350D may be designed so that the window region 321A overlaps with the boundary region (230 of FIG. 8).

According to the embodiments described above, nanoscale structures or nano structures can be fabricated on a large-sized substrate. The nano structures may be used in fabrication of polarizing plates or in formation of reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing parts on color filter substrates. Further, the nano structures may be used in molding processes for fabricating nanowire transistors or memories, molding processes for fabricating electronic/electric components such as nanoscaled interconnections, molding process for fabricating catalysts of solar cells and fuel cells, molding process for fabricating etch masks and organic light emitting diodes (OLEDs), and molding process for fabricating gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single chip package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of forming imprinted patterns, the method comprising:
    forming an imprint medium layer including an imprint region and a boundary region;
    providing an imprint template over the imprint medium layer, the imprint template including a mesa portion, a window region and a light blocking layer,
    wherein the mesa portion has a patterned surface that provides imprinting patterns, the light blocking layer is spaced apart from the patterned surface and is located outside the region of the patterned surface to define the window region, and the window region is a portion of the template between a portion of the light blocking layer and the patterned surface;
    lowering the imprint template to bring the imprinting patterns in contact with a surface of the imprint medium layer;
    irradiating a first exposure light through a portion of the window region to cure the boundary region of the imprint medium layer to form an extrusion barrier;
    embedding the imprinting patterns of the imprint template into the imprint region of the imprint medium layer; and
    irradiating a second exposure light through the patterned surface of the mesa portion to cure the imprint region of the imprint medium layer,
    wherein the embedding of the imprinting patterns into the imprint region of the imprint medium layer is performed after ending the irradiating of the first exposure light.

2. The method of claim 1, wherein the light blocking layer is disposed so that the portion of the window region overlaps with the boundary region.

3. The method of claim 1, wherein the light blocking layer is disposed so that the window region overlaps with the boundary region.

4. The method of claim 1, wherein the mesa portion includes:
    a first mesa portion providing the patterned surface; and
    a second mesa portion from which the first mesa portion protrudes;
    wherein the second mesa portion has a stepped surface which is located at a different level from the patterned surface to provide the window region.

5. The method of claim 4,
    wherein the stepped surface of the second mesa portion extends from a side surface of the first mesa portion to have a horizontally flat profile;
    wherein the second mesa portion further includes an inclined surface extending from the stepped surface; and
    wherein the inclined surface is covered with the light blocking layer.

6. The method of claim 5, wherein a portion of the stepped surface is covered with the light blocking layer.

7. The method of claim 1,
    wherein the first exposure light and the second exposure light are alternately provided by an exposure system; and
    wherein the exposure system includes:
    a light source configured for generating an ultraviolet ray; and
    a mirror device having micromirrors configured to reflect a portion of the ultraviolet ray outputted from the light source to generate the first exposure light.

8. The method of claim 7, wherein the mirror device includes a digital micromirror device (DMD) having an array of the micromirrors.

9. The method of claim 1,
    wherein the first exposure light is irradiated onto the portion of the window region and a portion of the light blocking layer; and
    wherein the light blocking layer blocks the first exposure light.

* * * * *